United States Patent
Okai et al.

(10) Patent No.: US 8,471,237 B2
(45) Date of Patent: Jun. 25, 2013

(54) CIRCUIT BOARD INCLUDING A GRAPHENE FILM HAVING CONTACT REGION COVERING A RECESSED REGION AND A PATTERNED METAL FILM COVERING THE CONTACT REGION AND IN DIRECT ELECTRICAL CONTACT THEREWITH, AND DEVICE INCLUDING SAME

(75) Inventors: Makoto Okai, Tokorozawa (JP); Motoyuki Hirooka, Kumagaya (JP); Yasuo Wada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 100 days.

(21) Appl. No.: 13/013,984

(22) Filed: Jan. 26, 2011

(65) Prior Publication Data

US 2011/0198558 A1 Aug. 18, 2011

(30) Foreign Application Priority Data

Jan. 27, 2010 (JP) .................................. 2010-015081

(51) Int. Cl.
*H01L 29/06* (2006.01)
*H01L 29/40* (2006.01)
(52) U.S. Cl.
USPC ........... 257/9; 257/621; 257/E21.28; 977/734
(58) Field of Classification Search
USPC ..................... 257/9, 621, E21.28; 977/734
See application file for complete search history.

(56) References Cited

U.S. PATENT DOCUMENTS

| 2010/0200839 A1* | 8/2010 | Okai et al. ...................... 257/29 |
| 2011/0101308 A1* | 5/2011 | Avouris et al. .................. 257/27 |
| 2011/0108805 A1* | 5/2011 | Okai .............................. 257/26 |

OTHER PUBLICATIONS

Lee et al., "Formation of Low-Resistance Ohmic Contacts Between Carbon Nanotube and Metal Electrodes by a Rapid Thermal Annealing Method," J. Phys. D: Appl. Phys., 2000, pp. 1953-1956, vol. 33.

* cited by examiner

*Primary Examiner* — Thanh V Pham
(74) *Attorney, Agent, or Firm* — Antonelli, Terry, Stout & Kraus, LLP.

(57) ABSTRACT

A circuit board having a graphene circuit according to the present invention includes: a base substrate; a patterned aluminum oxide film formed on the base substrate, the patterned aluminum oxide film having an average composition of $Al_{2-x}O_{3+x}$ (where x is 0 or more), the patterned aluminum oxide film having a recessed region whose surface has one or more cone-shaped recesses therein; a graphene film preferentially grown only on the patterned aluminum oxide film, the graphene film having one or more graphene atomic layers, the graphene film having a contact region that covers the recessed region, the graphene film growing parallel to a flat surface of the recessed region and parallel to an inner wall surface of each cone-shaped recess of the recessed region; and a patterned metal film, a part of the patterned metal film covering and having electrical contact with the contact region, the patterned metal film filling each recess covered by the graphene film.

9 Claims, 5 Drawing Sheets

CIRCUIT BOARD INCLUDING A GRAPHENE FILM HAVING CONTACT REGION COVERING A RECESSED REGION AND A PATTERNED METAL FILM COVERING THE CONTACT REGION AND IN DIRECT ELECTRICAL CONTACT THEREWITH, AND DEVICE INCLUDING SAME

CLAIM OF PRIORITY

The present application claims priority from Japanese patent application serial no. 2010-015081 filed on Jan. 27, 2010, the content of which is hereby incorporated by reference into this application.

BACKGROUND OF THE INVENTION

1. Field of the Invention

The present invention relates to graphene electronic and/or photonic integrated circuits, and particularly to circuits having improved electrical contacts between a graphene film and metal electrodes.

2. Description of Related Art

Graphenes (also called graphene sheets) are a sheet of six-membered rings which does not form a closed surface, and are formed by connecting numerous benzene rings two-dimensionally. Carbon nanotubes are formed by rolling up a graphene sheet into a tubular structure. Graphites are formed by stacking multiple graphene sheets. Each carbon atom in a graphene sheet has an $sp^2$ hybrid orbital, and delocalized electrons are present at opposite surfaces of a graphene sheet.

The following typical physical properties of graphenes have been reported: (a) The carrier mobility is in the order of 200,000 $cm^2$/Vs, which is one order of magnitude higher than those of silicon (Si) crystals and is also higher than those of metals and carbon nanotubes. (b) The 1/f noises of typical nanodevices can be significantly reduced. (c) The refractive index is negative. (d) The surface electrons behave as if they have no mass. Because of these properties, graphenes are identified as a candidate for post-silicon electronic materials.

In order to realize graphene based electronic devices and optical integrated circuits, it is essential to establish good (e.g., low resistance) electrical contact between a graphene film and metal electrodes. Lee et al. reports the contact resistance between a carbon nanotube and a metal electrode (see, e.g., Jeong-O Lee, C Park, Ju-Jin Kim, Jinhee Kim, Jong Wan Park, and Kyung-Hwa Yoo: "Formation of low-resistance ohmic contacts between carbon nanotube and metal electrodes by a rapid thermal annealing method", J. Phys. D: Appl. Phys. 33, 1953 (2000)). The contact resistance described in the above paper is in fact the parallel resistance of the electrical resistance of the carbon nanotube itself and the contact resistance between the carbon nanotube and the metal electrode. As used herein and in the appended claims, the term "contact resistance" includes such parallel resistance as described in the above paper. According to the above paper, the contact resistance between the carbon nanotube and the metal electrode is in the order of magnitude of k$\Omega$ (0.5 to 50 k$\Omega$ at room temperature).

SUMMARY OF THE INVENTION

If a graphene film and a metal electrode are connected in the same manner as described in the above paper, the contact resistance therebetween would similarly be in the order of magnitude of k$\Omega$. However, such contact resistances of the order of magnitude of k$\Omega$ are too large to realize electronic/photonic integrated circuits. In view of the foregoing, it is an objective of the present invention to provide a graphene circuit board having good (low resistance) electrical contact between a graphene film and metal electrodes, and to provide a device including the graphene circuit board.

Unlike carbon nanotubes, graphenes are of a planar sheet structure. Therefore, the inventers consider that graphenes can form larger contact areas with metal electrodes than carbon nanotubes. The present invention is directed to reduce the overall contact resistance between a graphene film and a metal electrode by increasing the effective contact area and by reducing the electrical resistance of the graphene film itself.

According to one aspect of the present invention, there is provided a circuit board having a graphene circuit, which includes:

a base substrate;

a patterned aluminum oxide film formed on the base substrate, the patterned aluminum oxide film having an average composition of $Al_{2-x}O_{3+x}$ (where x is 0 or more), the patterned aluminum oxide film having a recessed region whose surface has one or more cone-shaped recesses therein;

a graphene film preferentially grown only on the patterned aluminum oxide film, the graphene film having one or more graphene atomic layers, the graphene film having a contact region that covers the recessed region, the graphene film growing parallel to a flat surface of the recessed region and parallel to an inner wall surface of each cone-shaped recess of the recessed region; and a patterned metal film, a part of the patterned metal film covering and having electrical contact with the contact region, the patterned metal film filling each recess covered by the graphene film.

As used herein and in the appended claims, the term "graphene film having one or more graphene atomic layers" refers to a graphene film consisting of 20 or less graphene sheets. A graphene film having more than 20 sheets has physical properties (such as electron mobility) that are almost the same as those of bulk graphites, and as a result various useful properties inherent to graphene will be lost. More preferably, the graphene film of the invention has 10 or less sheets.

In the above aspect of the present invention, the following modifications and changes can be made.

(i) A ratio of a depth of each recess to a mouth diameter of the recess is 1.5 to 10.

(ii) Regions of the patterned aluminum oxide film other than the one or more recesses of the recessed region of the patterned aluminum oxide film have an average thickness of 10 to 500 nm.

(iii) A ratio of a contact area between the graphene film of the contact region and the patterned metal film overlying the graphene film to a projected area of the contact region is 3 to 20.

(iv) A contact area between the graphene film of the contact region and the patterned metal film overlying the graphene film satisfies the following relationship of Equation (1) or (2):

$$\coth\left(\sqrt{\frac{r_{gp}}{r_c}}S\right) < 1.3 \qquad \text{Equation (1)}$$

$$\coth\left(\sqrt{\frac{r_{gp}}{r_c}}S\right) < 1.1 \qquad \text{Equation (2)}$$

where $r_{gp}$ (in units of $\Omega/\mu m^2$) denotes electrical resistance per unit area of the graphene film, $r_c$ (in units of $\Omega \mu m^2$)

denotes contact resistance per unit area between the graphene film and the patterned metal film, and S (in units of $\mu m^2$) denotes the contact area between the graphene film of the contact region and the patterned metal film overlying the graphene film.

(v) A device including the above circuit board, in which at least one of component parts comprising a channel of a field effect transistor, an optical emitting element, an optical receiving element and a wiring line is formed in the graphene film.

ADVANTAGES OF THE INVENTION

According to the present invention, it is possible to provide a graphene circuit board having good (low resistance) electrical contact between a graphene film and metal electrodes, and a device including the graphene circuit board. Furthermore, the invented graphene circuit board and the device can be fabricated at low cost.

DETAILED DESCRIPTION OF THE PREFERRED EMBODIMENTS

Preferred embodiments of the present invention will be described below by following the fabrication sequence and with reference to the accompanying drawings. The invention is not limited to the specific embodiments described below, but various modifications and combinations are possible without departing from the spirit and scope of the invention. In the drawings, like parts are designated by like reference numerals without repeating the description thereof.

Figure 1:
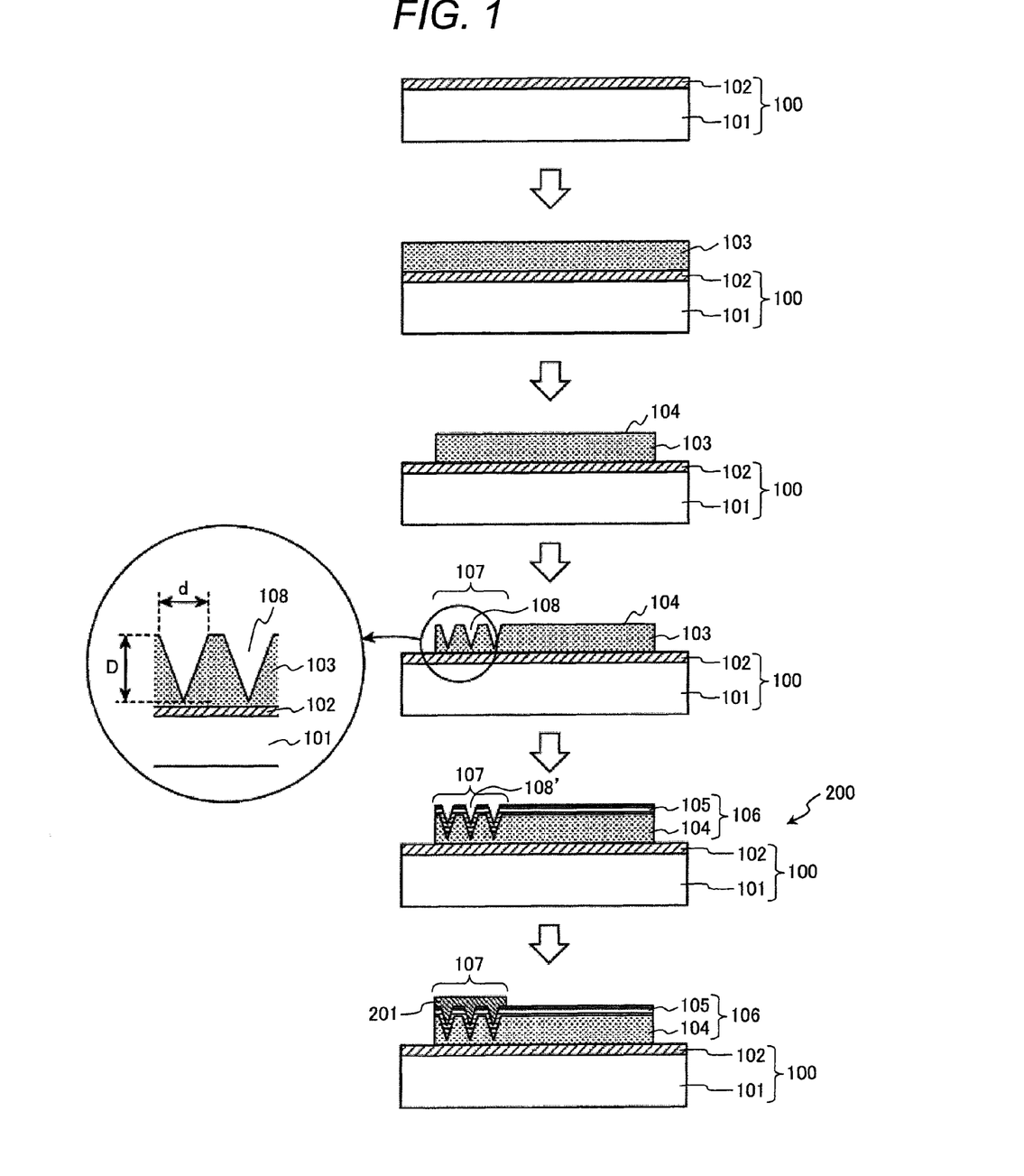
FIG. 1 is a schematic illustration showing cross sectional views of fabrication steps for fabricating a graphene circuit board according to an embodiment of the present invention.

FIG. 1 is a schematic illustration showing cross sectional views of fabrication steps for fabricating a graphene circuit board according to an embodiment of the present invention. First, a base substrate 100 is prepared by forming a silicon oxide film 102 (e.g., a 20 to 300 nm thick thermal oxide film) on a single crystalline silicon substrate 101 (e.g., of 2 inch diameter and 500 to 600 µm thickness). Then, an aluminum oxide film 103 having a corundum structure is formed on the surface of the base substrate 100 (i.e., on the surface of the silicon oxide film 102) by a physical vapor deposition technique (such as sputtering, ion beam deposition and laser evaporation). All the process sub-steps up to this point are collectively referred to as a "substrate preparation step".

The average composition of the aluminum oxide film 103 is preferably $Al_{2-x}O_{3+x}$ (x0, i.e., x is 0 or more), and more preferably $Al_{2-x}O_{3+x}$ (x>0). An aluminum oxide having such a composition can be obtained, for example, by controlling the oxygen partial pressure during vapor deposition. A graphene film having relatively large domains can be grown on such an oxygen-rich aluminum oxide film 103 having an O/Al ratio greater than stoichiometry (which will be described later in detail).

The aluminum oxide film 103 preferably has an arithmetic mean surface roughness Ra of 1 nm or less, and more preferably 0.3 nm or less. At an arithmetic mean surface roughness Ra more than 1 nm, a graphene film does not tend to grow in directions parallel to the surface of the underlying aluminum oxide film 103. This is probably because there is some correlation between the nucleation mechanism of graphene growth on an aluminum oxide film and the arithmetic mean surface roughness Ra of the aluminum oxide film. In addition, the aluminum oxide film 103 preferably has a maximum surface height Rz of 10 nm or less, and more preferably 3 nm or less.

When a resulting aluminum oxide film 103 has an arithmetic mean surface roughness Ra more than 1 nm, its surface is polished by, e.g., chemical mechanical polishing until its arithmetic mean surface roughness Ra becomes 1 nm or less. All the process sub-steps after the "substrate preparation step" to this sub-step are collectively referred to as a "surface smoothing step". Optionally, the single crystalline silicon substrate 101 and/or the silicon oxide film 102 may be polished so as to have an arithmetic mean surface roughness Ra of 1 nm or less before the formation of the aluminum oxide film 103. This sub-step is also included in the "surface smoothing step". As used herein, the term "arithmetic mean surface roughness Ra" and "maximum surface height Rz" are the ones defined in JIS B 0601.

The aluminum oxide film 103 preferably has an average thickness of 10 nm or more and 500 nm or less. An average thickness less than 10 nm is undesirable for the following reason: The crystal grains of the polycrystalline aluminum oxide film 103 do not coalesce sufficiently at thicknesses less than 10 nm (for example, the aluminum oxide film 103 grows like islands). Thus, the surface coverage of the silicon base substrate 100 with the aluminum oxide film 103 is insufficient, resulting in poor surface smoothness of the aluminum oxide film 103. On the other hand, an average thickness more than 500 nm is also undesirable because the resulting aluminum oxide film 103 is prone to suffer from cracks caused by, for example, thermal stresses undergone during subsequent processing, thus resulting in poor surface smoothness (as defined by, e.g., the arithmetic mean surface roughness Ra).

Meanwhile, the above-described specifications for the arithmetic mean surface roughness Ra, maximum surface height Rz and average thickness of the aluminum oxide film 103 are applied only to the regions other than the graphene/metal-electrode contact regions (i.e., other than the recessed regions).

There is no particular limitation on the method for forming the aluminum oxide film 103. Besides physical vapor deposition techniques, any method can be used as long as the above-described preferred average composition (O/Al ratio) and average thickness can be controllably obtained. For example, the aluminum oxide film 103 may be formed by growing an aluminum metal film on the silicon substrate 100 (i.e., on the silicon oxide film 102) followed by oxygen plasma processing or the like.

In addition, the base substrate 100 used to grow the aluminum oxide film 103 thereon is not limited to the above-described silicon oxide film 102 on the single crystalline silicon substrate 101, but other types of substrates may be used. The choice of the substrate is made in consideration of its resistance to thermal cycles during subsequent processes or the specific applications of the graphene film on the substrate (e.g., electronic-photonic integrated circuits). For example, various semiconductor substrates having an insulator film grown thereon and various insulator substrates can be used.

Next, the aluminum oxide film 103 on the base substrate 100 is patterned to form a desired circuit pattern using, e.g., a photolithography and liftoff technique conventionally used in semiconductor processing. This step is referred to as a "circuit patterning step". In this step, a region 104 of the aluminum oxide film 103 on which a wiring line is to be formed is left unremoved, and the remaining regions of the film 103 are completely removed. However, the silicon oxide film 102 is left unremoved as an insulator layer. The "surface smoothening step" may be conducted after the "circuit patterning step".

Then, by using a conventional photolithography and etching technique (e.g., reactive ion etching: RIE), the wiring line region 104 is provided with a recessed region 107 on which a graphene/metal-electrode contact region is to be formed. The recessed region 107 has one or more cone-shaped recesses 108 in its surface in order to increase the effective contact area of the graphene/metal-electrode contact region on the recessed region 107. This step is referred to as a "recess formation step". The detailed structure of the recess 108 will be described later. This "recess formation step" may be before, simultaneously with, or after the "circuit patterning step".

After the "circuit patterning step", a graphene film 105 is formed on the wiring line region 104 of the aluminum oxide film 103 by chemical vapor deposition (CVD) using a carbon-containing compound as a precursor. This is a "graphene film forming step". In this step, the graphene film 105 is formed in such a manner that the film 105 has a uniform thickness and grows parallel to the surface of the wiring line region 104 (including the inner wall surfaces of the recesses 108 in the recessed region 107). Thus, a substrate 200 having a graphene wiring line 106 (a patterned graphene film on a substrate) is fabricated.

An example of the CVD condition is as follows: The precursor is propylene ($C_3H_6$) and the carrier gas is argon (Ar). The average propylene concentration in the propylene/Ar mixture is 0.15 to 3% by volume. The average flow rate (in standard conditions) of the propylene/Ar mixture gas over the substrate is 15 to 50 standard cm/min. The growth temperature is 450 to 1000° C. (preferably 750 to 1000° C.) and the growth time is 0.1 to 60 min (preferably 0.1 to 10 min). Other carbon-containing compounds (such as acetylene ($C_2H_2$), methane ($CH_4$), propane ($C_3H_8$) and ethylene ($C_2H_4$)) may be employed as the precursor instead of propylene.

Finally, a metal layer 201 is formed on the region of the graphene film 105 on the recessed region 107 (a "metal layer formation step"). There is no particular limitation on the method for forming the metal layer 201. However, physical vapor deposition techniques (e.g., sputtering and other vapor depositions) are preferable in view of the excellent capability of filling the metal layer 201 in the graphene-covered recesses 108'. The metal layer 201 may be used as a metal electrode or a metal line. Or, on the metal layer 201 may be bonded a bulk metal such as bonding wire. Furthermore, there is no limitation on the material for the metal layer 201. Metal usually used as an electrode (such as gold, platinum and titanium) can be used.

(Structure of Recess)

The ratio of the depth to the mouth diameter ("recess depth D"/"recess mouth diameter d") of the cone-shaped recess 108 is preferably from 1.5 to 10. At (recess depth D/recess mouth diameter d) ratios of less than 1.5, the effect of increasing the effective contact area is too small, and therefore the contact resistance cannot be reduced. On the other hand, as the (recess depth D/recess mouth diameter d) ratio is increased to more than 10, it becomes difficult to completely fill the metal layer 201 in the graphene-covered recess 108' (in particular, into the bottom of the graphene-covered recess 108'), and therefore the effect of increasing the effective contact area becomes saturated. The cone shaped recess 108 is easy to form by etching, and the graphene-covered recess 108' is also easy to fill with the metal layer 201. Therefore, the manufacturing cost of the recess 108 is suppressed and also the manufacturing reliability is increased.

In addition, to form the recessed region 107 in such a regular structure having a flat surface and recesses 108 of a regular cone shape is very important in growing a graphene film parallel to the surface of the recessed region 107. The microstructure of a graphene film grown on a recessed region 107 was observed with a scanning tunneling microscopy and a high-resolution scanning electron microscopy. The result showed that the graphene film 105 did not break at boundaries between facets (e.g., at the edge of the recess mouth), but instead continuously bent around the recess mouth edges and continuously grew along the entire surface of the recessed region 107. Thus, according to the present invention, the graphene film 105 on the recessed region 107 (having the recesses 108) probably has the same electrical properties as those of the graphene film 105 on the flat surface of the wiring line region 104.

The microstructure of a graphene film grown on an irregular surface (e.g., the surface of a porous substrate) was also observed. The result showed that the domains of the graphene film were randomly oriented (not parallel to the surface), and the graphene film broke at many locations. Probably, the domains of such a graphene film grown on an irregular surface are not sufficiently electrically connected with one another.

The diameter of the mouth of each recess is preferably 5 nm or more. Thereby, a graphene film 105 more strongly tends to grow parallel to the surface of the recessed region 107 having both a flat surface and recesses 108. The shape of the mouth of the recess 108 is not limited to a perfect circle, but may be, e.g., elliptic or polygonal (i.e., the recess 108 may be an elliptical cone or a polygonal pyramid). For a mouth shape other than a perfect circle, the minimum width of the mouth is defined as the mouth diameter.

Figure 2:
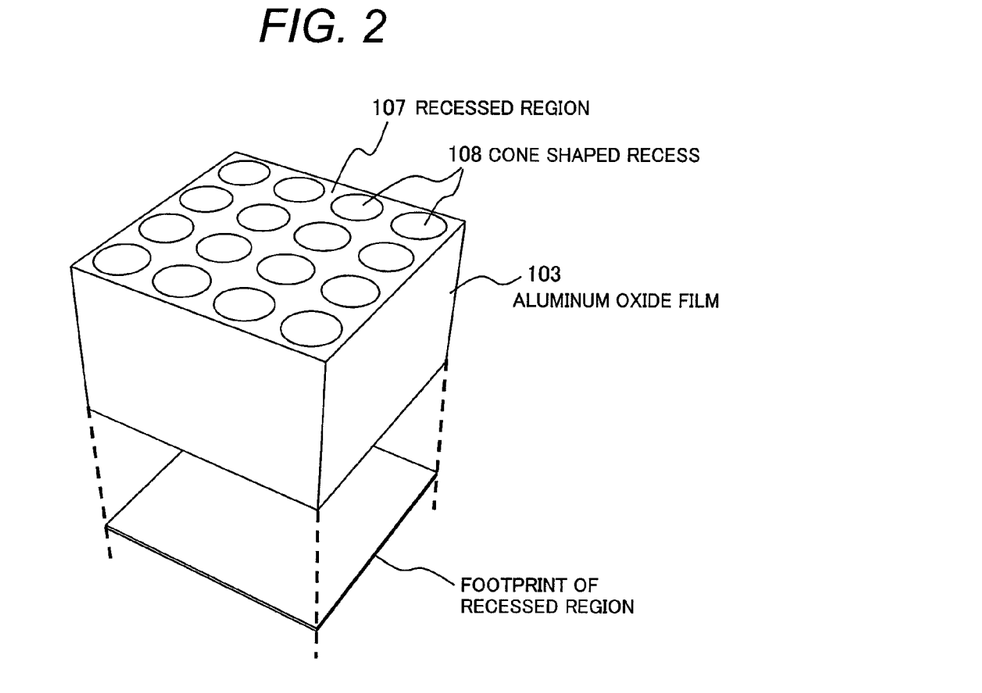
FIG. 2 is a schematic illustration showing an enlarged perspective view of a recessed region of an aluminum oxide film on which a graphene/metal-electrode contact region is to be formed.

As already described, unlike carbon nanotubes, graphenes are of a planar sheet structure. Therefore, graphenes can form larger contact areas with metal electrodes than carbon nanotubes. Desirably, in integrated circuits, all the metal contact regions occupy as small a surface area of the integrated circuit as possible. FIG. 2 is a schematic illustration showing an enlarged perspective view of a recessed region of an aluminum oxide film on which a graphene/metal-electrode contact region is to be formed. The cone shaped recesses 108 in the recessed region 107 in FIG. 2 are formed according to the above-specified (recess depth D/recess mouth diameter d) ratio range. Thereby, the ratio of the increased actual surface area of the recessed region 107 to the footprint (or projected area) of the recessed region 107 (the increased-actual-surface-area/projected-surface-area ratio) can be made to fall within a range from 3 to 20. As a result, the contact area between the graphene covered recessed region and the metal layer 201 overlying the graphene film can also be increased by 3 to 20 times.

(Discussion on Contact Resistance)

Let $r_{gp}$ (units: $\Omega/\mu m^2$) be the electrical resistance per unit area of a graphene film 105 itself, $r_c$ (units: $\Omega \mu m^2$) be the contact resistance per unit area between the graphene film 105 and a metal layer 201, and S be the contact area (units: $\mu m^2$) between the graphene film 105 and the metal layer 201, then the contact resistance R between the graphene film 105 and the metal layer 201 can be expressed by Equation (3) below as a function of S.

$$R(S) = \sqrt{r_{GP} r_C} \coth\left(\sqrt{\frac{r_{GP}}{r_C}} S\right) \quad \text{Equation (3)}$$

Figure 3:
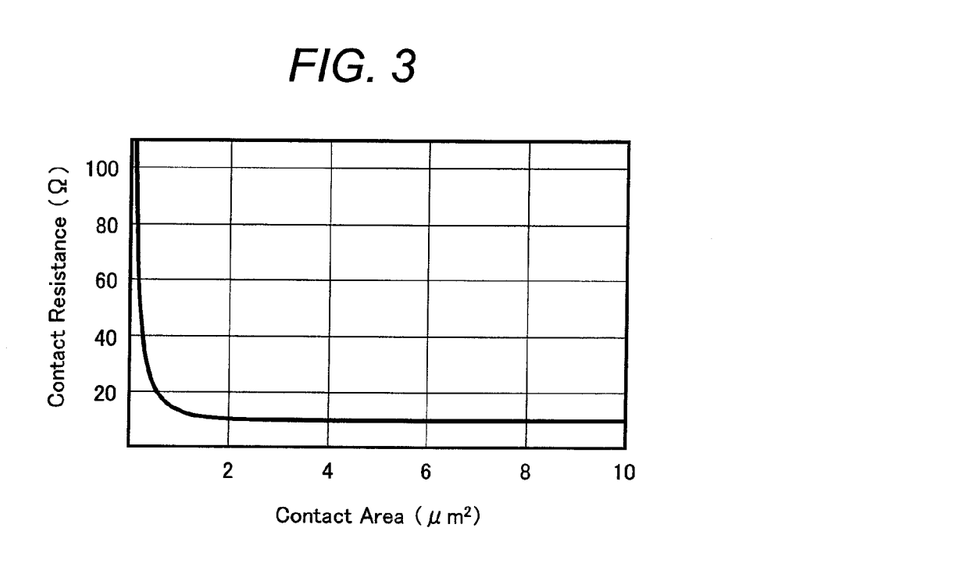
FIG. 3 is a graph of a calculation result showing a relationship between the contact resistance and the contact area of a graphene/metal-electrode contact interface.

In FIG. 3 are shown the R(S) values calculated by Equation (3) for the case where $r_{gp}=10\ \Omega/\mu m^2$ and $r_c=10\ \Omega \mu m^2$. FIG. 3 is a graph of a calculation result showing a relationship between the contact resistance and the contact area of a graphene/metal-electrode contact interface. As shown from Equation (3) and FIG. 3, as the contact area S increases, the contact resistance R(S) converges to the $(r_{gp} \cdot r_c)^{1/2}$ value. As already described, the graphene film according to the present invention can have a larger contact area S than carbon nanotubes. Therefore, the invention is advantageous in view of contact resistance compared to the above-mentioned technology reported by Lee et al. using a carbon nanotube.

Furthermore, by making the hyperbolic cotangent function term $(r_{gp} \cdot r_c)^{1/2}$ in Equation (3) to satisfy Equation (1) or (2) below, the contact resistance R can be suppressed to a level less than the value of $1.3(r_{gp} \cdot r_c)^{1/2}$ or to a level less than the value of $1.1(r_{gp} \cdot r_c)^{1/2}$, respectively.

$$\coth\left(\sqrt{\frac{r_{gp}}{r_c}} S\right) < 1.3 \quad \text{Equation (1)}$$

$$\coth\left(\sqrt{\frac{r_{gp}}{r_c}} S\right) < 1.1 \quad \text{Equation (2)}$$

As can be understood from the above discussion, by reducing the electrical resistance per unit area of a graphene film 105 itself (the $r_{gp}$ value in the term $(r_{gp} \cdot r_c)^{1/2}$, the contact resistance R can be reduced. The inventors found that the electrical resistance of a graphene film can be reduced by increasing the average domain size of graphene in the film. This finding will be described below.

(Measurement of Average Number of Graphene Atomic Layers)

The average number of the atomic layers of a graphene film grown according to the present invention was determined by the optical transmittance of the film. The optical transmittance T of one graphene atomic layer is given by Equation (4) (e: electron charge, c: light velocity, and h-bar: reduced Planck constant), and is theoretically predicted to be nearly constant irrespective of wavelength in the wavelength range from visible to infrared.

$$T = \left(1 + 0.5\frac{\pi e^2}{\hbar c}\right)^{-2} \approx 1 - \frac{\pi e^2}{\hbar c} \quad \text{Equation (4)}$$

Nair et al. reports that one graphene atomic layer has a constant optical transmittance Tc of 97.7% in the wavelength range from visible to infrared. See, e.g., R. R. Nair, P. Blake, A. N. Grigorenko, K. S, Novoselov, T. J. Booth, T. Stauber, N. M. R. Peres, and A. K. Geim: "Fine Structure Constant Defines Visual Transparency of Graphene", SCIENCE 320, 1308 (2008). By assuming Tc=97.7% according to the above report, the average number Lg of the atomic layers of a graphene film grown according to the invention was determined using Equation (5).

$$Lg = \frac{\log_{10}\frac{Tc}{100}}{\log_{10}0.977} \quad \text{Equation (5)}$$

Figure 4:
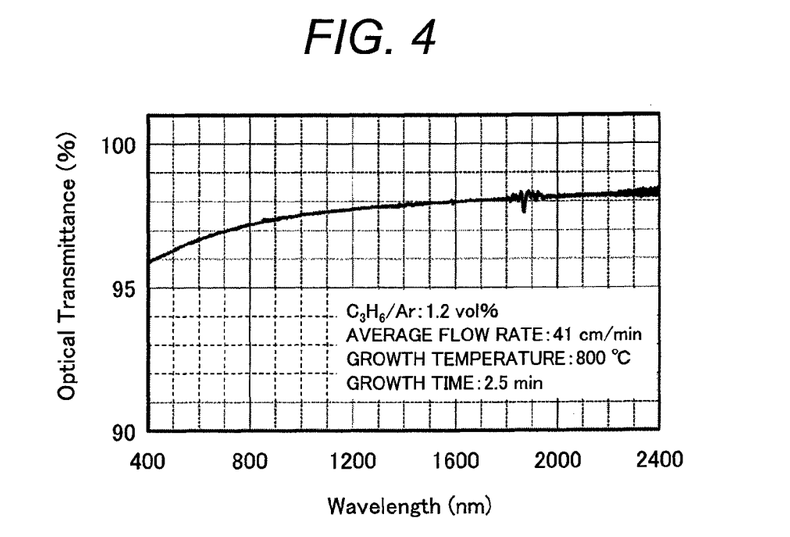
FIG. 4 is a graph of an exemplary optical transmittance spectrum of a graphene film grown on a substrate.

A measurement sample was prepared by growing a graphene film on a single crystalline aluminum oxide ($\alpha$-alumina) substrate under the following growth condition (precursor: propylene, carrier gas: argon, average precursor concentration: 1.2% by volume, average flow rate: 41 standard cm/min, growth temperature: 800° C., and growth time: 2.5 min). The optical transmittance measured for this sample is shown in FIG. 4. FIG. 4 is a graph of an exemplary optical transmittance spectrum of the above measurement sample. The optical transmittance measured for the above measurement sample was corrected using the optical transmittance of a single crystalline aluminum oxide substrate (without a graphene film) as a reference.

As shown in FIG. 4, the optical transmittance measured gradually increases with increasing wavelength in the shorter wavelength range (from 400 nm to 2000 nm), and remains at a constant value of Tc in the longer wavelength range (longer than about 2000 nm). The ripples between 1800 nm and 1900 nm and longer than 2200 nm are probably a noise due to moisture in the air. By using the thus obtained value for Tc in Equation (5), the average number Lg of the atomic layers of the graphene film of the measurement sample was determined to be 0.7.

(Measurements of Substrate/Graphene Inter-Atomic-Layer Distance and Domain Size)

For a graphene film sample grown according to the present invention, the distance between the atomic layer at the substrate surface and the graphene film's atomic layer adjacent to the substrate surface, and the domain size were measured with a scanning tunneling microscopy. Similarly to the sample for the optical transmittance measurement, a sample for this measurement was prepared by growing a graphene film on a single crystalline aluminum oxide substrate. Herein, this sample was grown so that the average number Lg of the atomic layers was less than 1.0. The reason for this is as follows: When a graphene film having an Lg value of less than 1.0 is grown on a substrate, the substrate has both regions on which graphene grows and regions on which graphene does not grow. This structure facilitates the measurements of the inter-atomic-layer distance and domain size.

For the thus prepared graphene film sample having an Lg value of less than 1.0, the measured distance between the atomic layer at the substrate surface and the graphene film's atomic layer adjacent to the substrate surface was 0.30 to 0.34 nm. This distance is nearly equal to the distance between adjacent atomic layers within a graphene film consisting of multiple atomic layers. This result strongly suggests that the graphene film grows in directions parallel to the substrate surface rather than just adhering to the substrate surface.

As for the domain size measurement, it was difficult to determine domain sizes larger than 10 nm using a scanning tunneling microscope. To address this problem, the electrical conductivities of multiple surface spots of a graphene film on a substrate were measured using a scanning tunneling microscope. Then, the domain sizes of the graphene film were determined from the distribution of the electrical conductivities. That is, the difference between the electrical conductivity of surface regions on which a single graphene atomic layer grew and the electrical conductivity of surface regions on which no graphene grew was utilized.

The distribution of the electrical conductivities was obtained as follows: The electrical conductivities of 10000 surface spots (a 100×100 matrix with a pitch of 1 nm) on a 100×100 nm surface area of the graphene film sample were measured. When, for a surface spot, a current of 20 pA or more was measured at an applied voltage of 2.5V, the surface spot was determined to have a graphene grown thereon; when, for a surface spot, a current less than 20 pA was measured at 2.5V, the surface spot was determined to have no graphene grown thereon. A separately conducted measurement showed that a current of 100 pA or more flowed at 2.5V at surface regions having a graphene grown thereon, while no or little current (less than 5 pA at 2.5V) flowed at surface regions having no graphene grown thereon.

Figure 5:
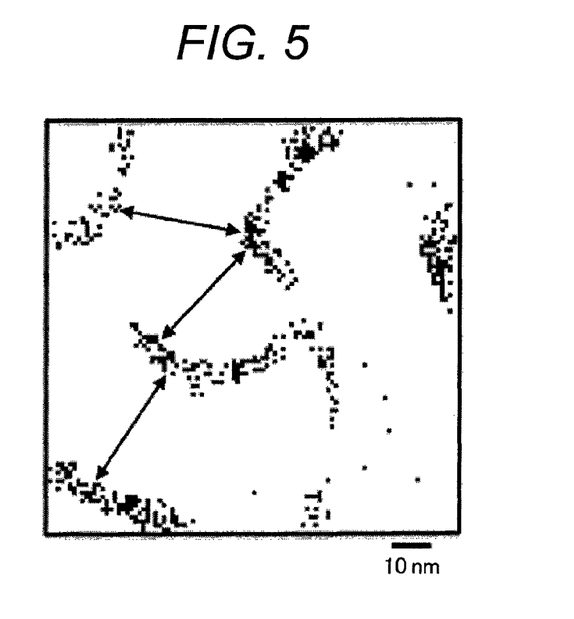
FIG. 5 is a map of an exemplary electrical conductivity distribution measured in a surface area (100×100 nm) of a graphene film grown on a substrate.

FIG. 5 is a map of an exemplary electrical conductivity distribution measured in a surface area (100×100 nm) of a graphene film grown on a substrate. The sample for the measurement in FIG. 5 was prepared by growing a graphene film having an Lg value of 0.7 on a single crystalline aluminum oxide substrate under the following growth condition (precursor: propylene, carrier gas: argon, average precursor concentration: 1.2% by volume, average flow rate: 41 standard cm/min, growth temperature: 800° C., and growth time: 2.5 min). In FIG. 5, a surface spot that is determined to have a graphene grown thereon is marked with a white dot; a surface spot that is determined to have no graphene grown thereon is marked with a black dot.

In FIG. 5, it is natural to think that lines consisting of black dots are graphene domain boundaries. Based on this natural thought, it is determined that a region surrounded by black dot lines is a graphene domain, and the size of the graphene domain is the width of the region (as indicated by a double-pointed arrow in FIG. 5). The average domain size of a graphene film was determined as follows: The electrical conductivity distribution measurement was conducted for ten surface areas (each being 100×100 nm), and the sizes of three domains in each surface area were measured. The average domain size was calculated by averaging the total of the 30 domain sizes measured.

(Influence of Growth Condition on Graphene Film Properties)

The influence of the growth condition on the properties of a graphene film was investigated. A single crystalline aluminum oxide substrate was used for this investigation. First, the relationship between the average number of graphene atomic layers and the growth condition (temperature and time) was investigated. In this investigation, two different conditions for the average precursor concentration and the average flow rate (in standard conditions) were employed, and the above-mentioned relationship was investigated for each condition. The condition for the average precursor concentration and the average flow rate was changed by changing the flow rate of the carrier gas (argon) while fixing the flow rate of the precursor gas (propylene). The result showed that the average number of the atomic layers of a graphene film is proportional to the growth time and is increased with increasing average precursor concentration. Thus, the average number of the atomic layers of a graphene film can be changed mainly by changing the growth time.

Next, the influence of the growth temperature on the average domain size of a graphene film was investigated. The average number of the atomic layers of the graphene films used to perform this investigation was less than 1.0. The result showed that the average domain size was approximately 29 nm at a growth temperature of 800° C., and approximately 31 nm at 900° C. Thus, the growth temperature probably did not significantly influence the average domain size (i.e., the growth temperature was not a main factor affecting the average domain size).

Further, the influence of the growth time on the average domain size of a graphene film was investigated. This investigation was done by changing the growth time while maintaining the average number of graphene atomic layers at 0.5 to 1.0. The result showed that the variation in average domain size was less than 10% irrespective of the growth time. Thus, like the growth temperature, the growth time probably did not significantly influence the average domain size (i.e., the growth time was not a main factor affecting the average domain size).

(Relationship Between Average Composition of Aluminum Oxide ($Al_{2-x}O_{3+x}$) Film and Graphene Domain Size)

The relationship between the average composition (O/Al ratio) of the underlying aluminum oxide ($Al_{2-x}O_{3+x}$) film and the graphene domain size was investigated. As already described, in forming an aluminum oxide film 103 by a physical vapor deposition technique (such as sputtering, ion beam deposition and laser evaporation), the O/Al ratio of the aluminum oxide film 103 can be changed by controlling the oxygen partial pressure during the vapor deposition. In this investigation, 150 nm thick films of aluminum oxides ($Al_{2-x}O_{3+x}$) were formed on a substrate by sputtering. Each aluminum oxide ($Al_{2-x}O_{3+x}$) had a different O/Al ratio (i.e., in each aluminum oxide a different number of oxygen atoms occupied aluminum lattice sites). The O/Al ratio was changed by changing the oxygen/argon partial pressure ratio in the sputtering atmosphere. The substrate used was a 200 nm thick silicon oxide film thermally grown on a single crystalline silicon substrate (diameter: 2 inches, and thickness: 525 μm).

The average compositions of the thus formed aluminum oxide ($Al_{2-x}O_{3+x}$) films were measured using an X-ray photoelectron spectroscopy (XPS) apparatus manufactured by Shimadzu Corporation. The result showed that each of the thus formed aluminum oxide ($Al_{2-x}O_{3+x}$) films had a different x value (from −0.3 to 0.32). Also, the thus formed aluminum oxide ($Al_{2-x}O_{3+x}$) films had an arithmetic mean surface roughness Ra of 1 nm or less. Then, on each aluminum oxide ($Al_{2-x}O_{3+x}$) film was formed a graphene film having an Lg value of 0.7 under the following growth condition (precursor: propylene, carrier gas: argon, average precursor concentration: 1.2% by volume, average flow rate (in standard conditions): 41 standard cm/min, growth temperature: 800° C., and growth time: 2.5 min). The average domain size of the thus grown graphene films was determined by the above-described electrical conductivity distribution measurement.

Figure 6:
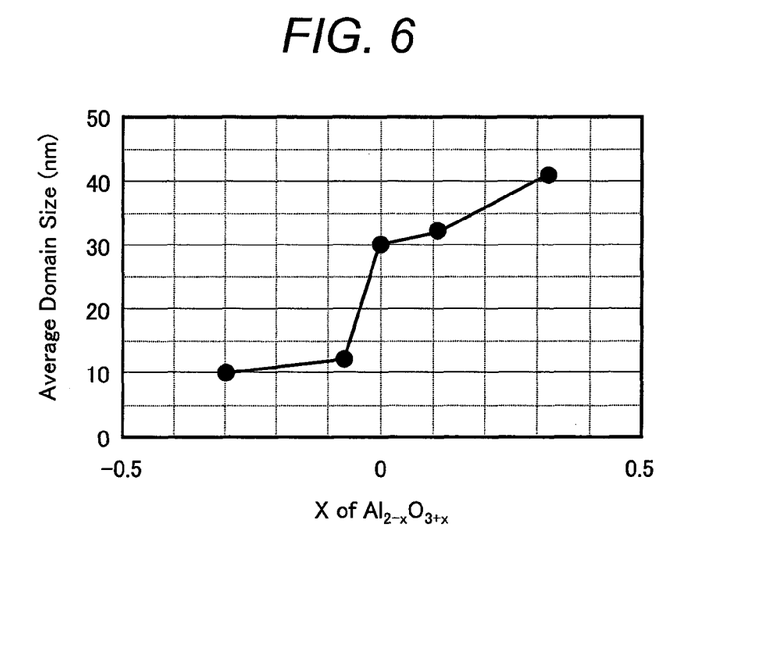
FIG. 6 is a graph showing a relationship between an average domain size of a graphene film and x value in an underlying $Al_{2-x}O_{3+x}$ film.

FIG. 6 is a graph showing a relationship between an average domain size of a graphene film and an elemental concentration of oxygen in an underlying aluminum oxide ($Al_{2-x}O_{3+x}$) film (specifically, an x value in the $Al_{2-x}O_{3+x}$ film). As shown in FIG. 6, the greater the x value in an underlying $Al_{2-x}O_{3+x}$ film, the larger the average domain size of a graphene film grown on the $Al_{2-x}O_{3+x}$ film. In particular, a graphene film having a larger average domain size can be formed on an aluminum oxide ($Al_{2-x}O_{3+x}$) film having an x value of 0 or more (i.e., an oxygen rich aluminum oxide film having an elemental concentration of oxygen equal to or higher than stoichiometry). As can also be seen from FIG. 6, it is more preferable that the x value is more than 0 (i.e., x>0).

(Relationship Between Graphene Average Domain Size and Electrical Resistivity)

As already discussed, by reducing the electrical resistance per unit area of a graphene film itself, the contact resistance between the graphene film and a metal layer can be reduced. Graphene films consist of numerous graphene domains, and are therefore a type of polycrystalline film. Hence, the electrical conduction between neighboring graphene domains is very important for good electrical conductance of the graphene film itself. In this context, the electrical resistivity of graphene films was investigated.

The samples for this investigation were fabricated according to the fabrication steps of FIG. 1. First, aluminum oxide films having a corundum structure were formed on a silicon oxide ($SiO_2$) film thermally grown on a single crystalline silicon (Si) substrate by sputtering. The elemental concentration of oxygen in the aluminum oxide ($Al_{2-x}O_{3+x}$) films were changed by changing the oxygen partial pressure in the sputtering atmosphere. The thus formed aluminum oxide ($Al_{2-x}O_{3+x}$) films had an arithmetic mean surface roughness Ra of 1 nm or less. Then, several striplines (2 μm wide and 1 mm long) were formed in each aluminum oxide film by photolithography and liftoff. Herein, the regions other than the striplines were completely removed. Finally, a graphene film having an Lg value of approximately 1.0 was grown on each of the above substrates (having the striplines) under the following growth condition (precursor: propylene, carrier gas: argon, and growth temperature: 800° C.). As described above, each of the thus grown graphene films had a different average domain size.

The thus formed graphene films were observed with a scanning tunneling microscopy. For all of the graphene films, a graphene film grew only on the striplines, and no graphene film grew on the thermal silicon oxide film (where the overlying aluminum oxide film had been removed). In other words, a graphene film preferentially grew only on the striplines of each aluminum oxide film. This result suggests that there is some difference in the nucleation and crystal growth mechanisms of graphene between on an aluminum oxide film and on a thermal Si oxide film.

Figure 7:
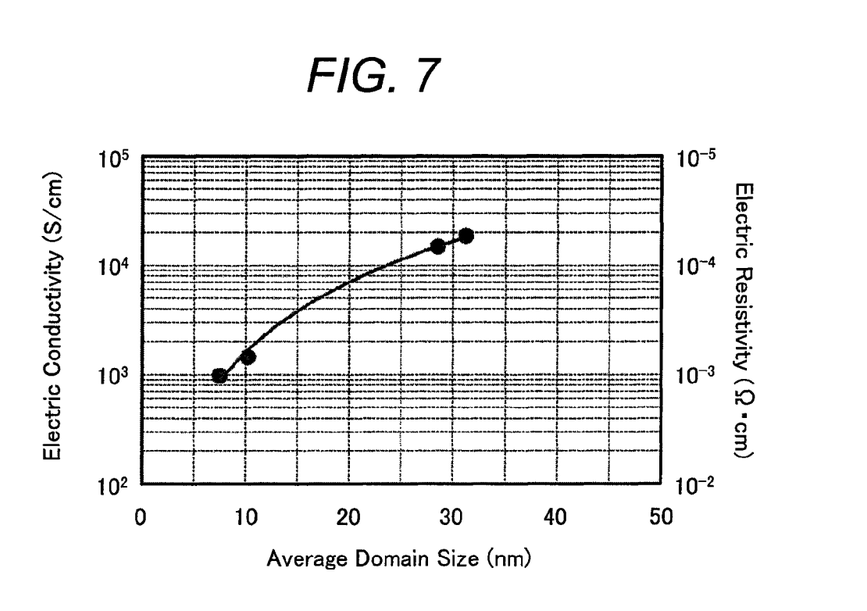
FIG. 7 is a graph showing a relationship between an average domain size of a graphene film and an electrical conductivity and resistivity of the graphene film.

Next, the electrical conductivity and resistivity of the graphene film on a stripline of each sample were measured by a four-probe resistive method. The inter-probe-distance (the distance between voltage probes) was 0.2 mm. FIG. 7 is a graph showing a relationship between an average domain size of a graphene film and an electrical conductivity and resistivity of the graphene film. In FIG. 7, the left ordinate axis represents the electrical conductivity, and the right ordinate axis represents the electrical resistivity.

As can be seen from FIG. 7, the electrical resistivity dramatically decreases (i.e., the electrical conductivity dramatically increases) with increasing average domain size. More specifically, as the average domain size increases from around 10 nm to around 30 nm, the electrical resistivity of the graphene film decreases by about one order of magnitude to $1 \times 10^{-4}$ Ωcm or less. This result shows that the electrical resistivity of a graphene film can be reduced by increasing the average domain size of the graphene film. In other words, a graphene film grown on a substrate according to the present invention is a continuous film in which good electrical conduction is established between neighboring domains.

(Electronic-Photonic Integrated Circuit Formed on Graphene Film on Substrate)

Figure 8:
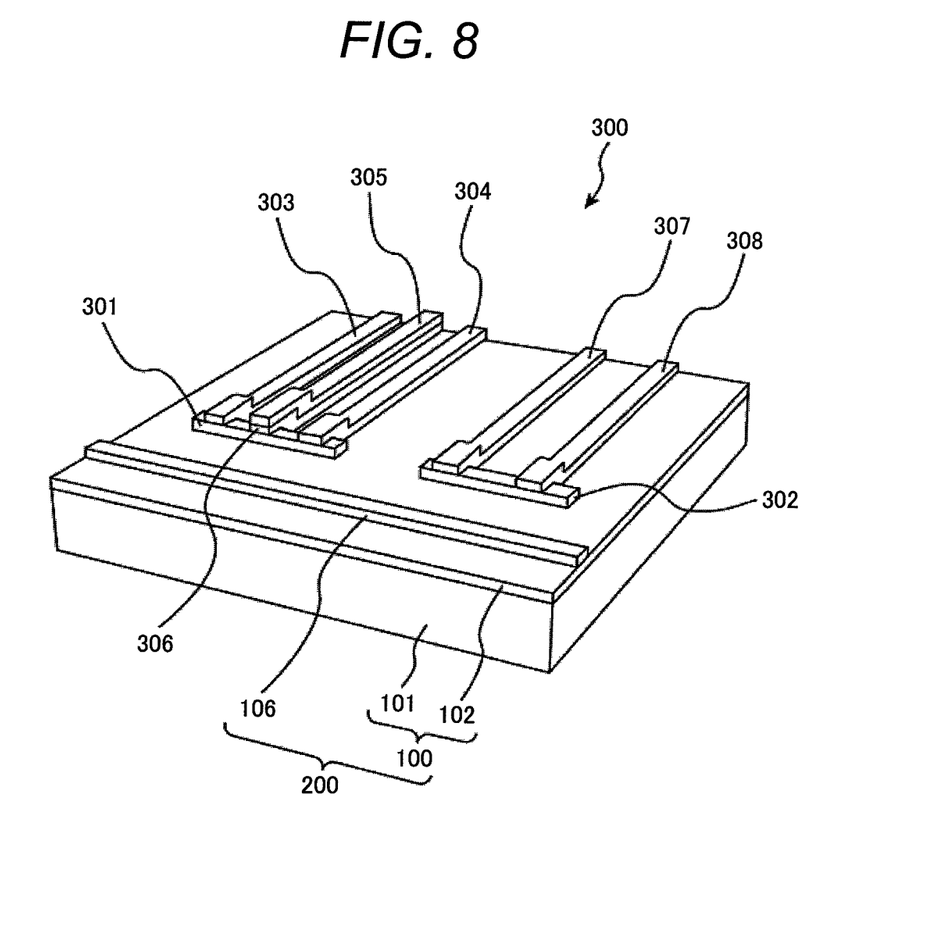
FIG. 8 is a schematic illustration showing a perspective view of an electronic-photonic integrated circuit as an example of a device including an invented graphene circuit board in which a graphene film is in good electrical contact with metal electrodes.

FIG. 8 is a schematic illustration showing a perspective view of an electronic-photonic integrated circuit as an example of a device including an invented graphene circuit board in which a graphene film is in good electrical contact with metal electrodes. An exemplary electronic-photonic integrated circuit 300 in FIG. 8 has the following structure: An aforementioned substrate 200 having graphene wiring lines 106 formed thereon is used. And, a channel region 301 of a graphene field effect transistor is formed in a part of the graphene wiring lines 106 and also an active region 302 of a graphene optical emitting/receiving element is formed in another part of the graphene wiring lines 106. The substrate 200 can be fabricated, for example, according to the fabrication steps shown in FIG. 1.

The channel region 301 of the graphene field effect transistor is provided with a source electrode 303, a drain electrode 304, and a gate electrode 305 on a gate dielectric 306. As described before in FIG. 1, at the contact regions with the source and drain electrodes 303 and 304, the surfaces of the graphene film are provided with recesses. The gate electrode 305 is formed on the gate dielectric 306. Therefore, at the contact region with the gate electrode 305 on the gate dielectric 306, the surface of the graphene film may or may not be provided with recesses. In this manner, a high mobility graphene field effect transistor can be formed.

The active region 302 of the graphene optical emitting/receiving element is provided with a positive electrode 307 and a negative electrode 308. Again, at the contact regions with the positive and negative electrodes 307 and 308, the surfaces of the graphene films are provided with recesses. In graphene optical emitting elements, electrons and holes are injected from the opposite electrodes into the graphene active region having a certain band gap, where they combine by direct transition to generate light. Graphene optical receiving elements detect light in the following manner: Electrons and holes are generated in the graphene active region having a certain band gap by light irradiation, and the thus generated electrons and holes are collected by applying a voltage across the opposite electrodes.

As has been described above, the present invention can reduce the contact resistance between a graphene film and a metal electrode. Thus, the invention can provide a graphene circuit board having low graphene/metal-electrode contact resistance, and a device including the graphene circuit board. Also, the invented method for forming a graphene circuit board having low graphene/metal-electrode contact resistance does not require any ultrahigh vacuum processes or any special manufacturing equipment, and therefore the manufacturing equipment cost can be suppressed. In addition, in the invented graphene circuit board, the graphene film can be grown at relatively low temperatures, and therefore cheap and large substrates conventionally widely employed in many electronic devices can be used as a starting base substrate. Thus, the invented graphene circuit board contributes to the industrial realization and cost reduction of future electronic-photonic integrated circuits.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A circuit board having a graphene circuit, comprising:
a base substrate;
a patterned aluminum oxide film formed on the base substrate, the patterned aluminum oxide film having a composition of $Al_{2-x}O_{3+x}$ (where x is 0 or more), the patterned aluminum oxide film having a recessed region whose surface has a flat surface and has one or more cone-shaped recesses therein;
a graphene film preferentially grown only on the patterned aluminum oxide film, the graphene film having one or more graphene atomic layers, the graphene film having a contact region that covers the recessed region, the graphene film growing parallel to the flat surface of the recessed region and parallel to an inner wall surface of each cone-shaped recess of the recessed region; and
a patterned metal film, an entirety of the contact region being covered by a part of the patterned metal film and having electrical contact directly with the patterned metal film, the patterned metal film filling each recess covered by the graphene film.

2. The circuit board according to claim 1, wherein a ratio of a depth of each recess to a mouth diameter of the recess is 1.5 to 10.

3. The circuit board according to claim 1, wherein regions of the patterned aluminum oxide film other than the one or more recesses of the recessed region of the patterned aluminum oxide film have an average thickness of 10 to 500 nm.

4. The circuit board according to claim 1, wherein a ratio of a contact area between the graphene film of the contact region and the patterned metal film overlying the graphene film to a projected area of the contact region is 3 to 20.

5. The circuit board according to claim 1, wherein a contact area between the graphene film of the contact region and the patterned metal film overlying the graphene film satisfies the following relationship of Equation (1):

$$\coth\left(\sqrt{\frac{r_{gp}}{r_c}}S\right) < 1.3 \quad \text{Equation (1)}$$

where $r_{gp}$ (in units of $\Omega/\mu m^2$) denotes electrical resistance per unit area of the graphene film, $r_c$ (in units of $\Omega\mu m^2$) denotes contact resistance per unit area between the graphene film and the patterned metal film, and S (in units of $\mu m^2$) denotes the contact area between the graphene film of the contact region and the patterned metal film overlying the graphene film.

6. The circuit board according to claim 1, wherein a contact area between the graphene film of the contact region and the patterned metal film overlying the graphene film satisfies the following relationship of Equation (2):

$$\coth\left(\sqrt{\frac{r_{gp}}{r_c}}S\right) < 1.1 \quad \text{Equation (2)}$$

where $r_{gp}$ (in units of $\Omega/\mu m^2$) denotes electrical resistance per unit area of the graphene film, $r_c$ (in units of $\Omega\mu m^2$) denotes contact resistance per unit area between the graphene film and the patterned metal film, and S (in units of $\mu m^2$) denotes the contact area between the graphene film of the contact region and the patterned metal film overlying the graphene film.

7. A device, including the circuit board according to claim 1, wherein at least one of component parts comprising a channel of a field effect transistor, an optical emitting element, an optical receiving element and a wiring line is formed in the graphene film.

8. The circuit board according to claim 1, wherein the patterned aluminum oxide film has an arithmetic mean surface roughness Ra of 1 nm or less.

9. The circuit board according to claim 8, wherein the patterned aluminum oxide film also has a maximum surface height Rz of 10 nm or less.

* * * * *